United States Patent [19]

Kwon

[11] Patent Number: 5,896,048
[45] Date of Patent: Apr. 20, 1999

[54] METHOD FOR DETERMINING ACTIVE/STAND-BY MODE FOR USE IN A DUPLICATED SYSTEM

[75] Inventor: Hwan-Woo Kwon, Incheon, Rep. of Korea

[73] Assignee: Daewoo Telecom, Ltd., Incheon, Rep. of Korea

[21] Appl. No.: 08/976,688

[22] Filed: Nov. 24, 1997

[30] Foreign Application Priority Data

Dec. 23, 1996 [KR] Rep. of Korea ............ 96-70621

[51] Int. Cl.$^6$ ............................................. G01R 19/00
[52] U.S. Cl. ........................... 327/19; 327/141; 327/142
[58] Field of Search .............................. 327/18, 19, 20, 327/22, 23, 24, 25, 26, 27, 36, 141, 142, 143, 144

[56] References Cited

U.S. PATENT DOCUMENTS 3,751,685  8/1973  Jaeger ........................... 307/219

Primary Examiner—Timothy P. Callahan
Assistant Examiner—Jeffrey Zweizig
Attorney, Agent, or Firm—Pennie & Edmonds LLP

[57] ABSTRACT

An active/stand-by determination method for use in a duplicated system, wherein two elements, one given a priority and the other not given a priority, in the duplicated system operate in an active mode and a stand-by mode alternatively by using an X_ACTIVE signal, a S_ACTIVE signal, a STATUS signal for each element and a SIDE signal, the method comprising the steps of: a) setting both the elements in the stand-by mode upon power-on; b) checking the X_ACTIVE signal and the STATUS signal at both the elements; c) entering into the active mode if it is determined at the step b) that both the X_ACTIVE signal and the STATUS signal are "high"; d) remaining in the stand-by mode if it is determined at the step b) that at least one of the X_ACTIVE signal and the STATUS signal is "low"; e) checking if both the elements are in the active mode; f) checking the SIDE signal if it is determined that both the elements are in the active mode at the step e); and g) moving an element given a priority into the stand-by mode if the SIDE signal is determined to be "low" at the step f).

5 Claims, 4 Drawing Sheets

METHOD FOR DETERMINING ACTIVE/ STAND-BY MODE FOR USE IN A DUPLICATED SYSTEM

FIELD OF THE INVENTION

The present invention relates to an electronic switching system; and, more particularly, to a method for determining active/stand-by mode of a duplicated system for use in an electronic switching system.

BACKGROUND OF THE INVENTION

A duplication has been one of the most established tactical schemes in designing important parts of an electronic switching system. The electronic switching system becomes more reliable by employing the duplication.

In a duplicated system, a couple, or more than two in certain events, of subsystems form duplicated mates and the duplicated mates operate alternatively by swinging between an active mode and a stand-by mode. Typically, one of the duplicated mates, the one in the active mode, operates normally while the other in the stand-by mode is waiting ready for a switch-over to an active mode. Conventionally, logic devices have been used for determining the active mode and the stand-by mode of the duplicated mates.

Conventional apparatus for determining the active mode and the stand-by mode of the duplicated system is given in FIGS. 1 and 2.

FIG. 1 shows a half of the apparatus, employed in each subsystem in the duplicated system, for determining the active and the stand-by mode of the duplicated system.

A S_FUN_FAIL(self function fail) is a signal indicating whether a subsystem is in a normal condition or is in a functionally failed condition. A S_ACTIVE(self active) is a signal telling whether a subsystem in the duplicated system is in the active mode or in the stand-by mode; an X_ACTIVE (external active) is a signal signifying whether a counterpart of a subsystem in the duplicated system is in the active mode or in the stand-by mode.

For the purpose of illustration, it is assumed that: a subsystem is in the active mode when the S_ACTIVE is "low", in the stand-by mode when the S_ACTIVE is "high"; a counterpart is in the active mode when the X_ACTIVE is "low", in the stand-by mode when the X_ACTIVE is "high"; a subsystem is in the normal condition when the S_FUN_FAIL is "high", in the functionally failed condition when the S_FUN_FAIL is "low".

When a subsystem is turned on, it may be designed that the X_ACTIVE is set to "high". It is assumed that the S_FUN_FAIL is "high". An output of an AND gate 11 becomes "high". Then, regardless of an output of an AND gate 12, the S_ACTIVE, an output of a NOR gate 13, becomes "low". A feedback through an inverter 14 does not affect states of outputs of the NOR gate 13.

If the S_FUN_FAIL is "low", which suggests that the apparatus is in the functionally failed condition, outputs of the AND gates 11, 12 are "low", which, in turn, produces a result that the S_ACTIVE is "high". The subsystem enters into the stand-by mode.

As can be shown from the conventional apparatus in FIG. 2, each subsystem, the A side or the B side, receives a S_ACTIVE signal of its counterpart and regards the S_ACTIVE as the X_ACTIVE of its own. Upon a power-on, both the S_ACTIVE and the S_FUN_FAIL determine the active and the stand-by modes, and the determined mode remains intact as long as the S_FUN_FAIL remains "high". All the operation of the conventional apparatus is asynchronous.

The conventional duplicated system may come across a conflict that the two of the duplicated mates are in a same mode since it operates asynchronously. For example, when the X_ACTIVE is "low", which suggests that the counterpart subsystem is in the active mode, and the S_FUN_FAIL is "high", the S_ACTIVE is in a logically ambiguous condition, in other words, the S_ACTIVE can be either "high" or "low". In the event that the S_AVTIVE is "low", a conflict of bidding the same active mode occurs. The conflict may bring about a halt in the operation of the duplicated system. The conventional apparatus, however, provides no means for resolving this conflict.

SUMMARY OF THE INVENTION

It is, therefore, a primary object of the present invention to provide a method of determining an active/stand-by mode so that a duplicated system operates in synchronism with a clock signal, and thereby, operates more reliably, and further, a conflict of the two duplicated mates can be effectively avoided.

In accordance with the present invention, there is provided an active/stand-by determination method for use in a duplicated system, wherein two elements, one given a priority and the other not given a priority, in the duplicated system operate in an active mode and a stand-by mode alternatively by using an X_ACTIVE signal, a S_ACTIVE signal, a STATUS signal for each element and a SIDE signal, the method comprising the steps of: a) setting both the elements in the stand-by mode upon power-on; b) checking the X_ACTIVE signal and the SELF_STATUS signal at both the elements; c) entering into the active mode if it is determined at the step b) that both the X_ACTIVE signal and the STATUS signal are "high"; d) remaining in the stand-by mode if it is determined at the step b) that at least one of the X_ACTIVE signal and the STATUS signal is "low"; e) checking if both the elements are in the active mode; f) checking the SIDE signal if it is determined that both the elements are in the active mode at the step e); and g) moving an element given a priority into the stand-by mode if the SIDE signal is determined to be "low" at the step f).

BRIEF DESCRIPTION OF THE DRAWINGS

The above and other objects and features of the present invention will become apparent from the following description of preferred embodiments given with reference to the accompanying drawings, in which.

DETAILED DESCRIPTION OF THE PREFERRED EMBODIMENT

Figure 1:
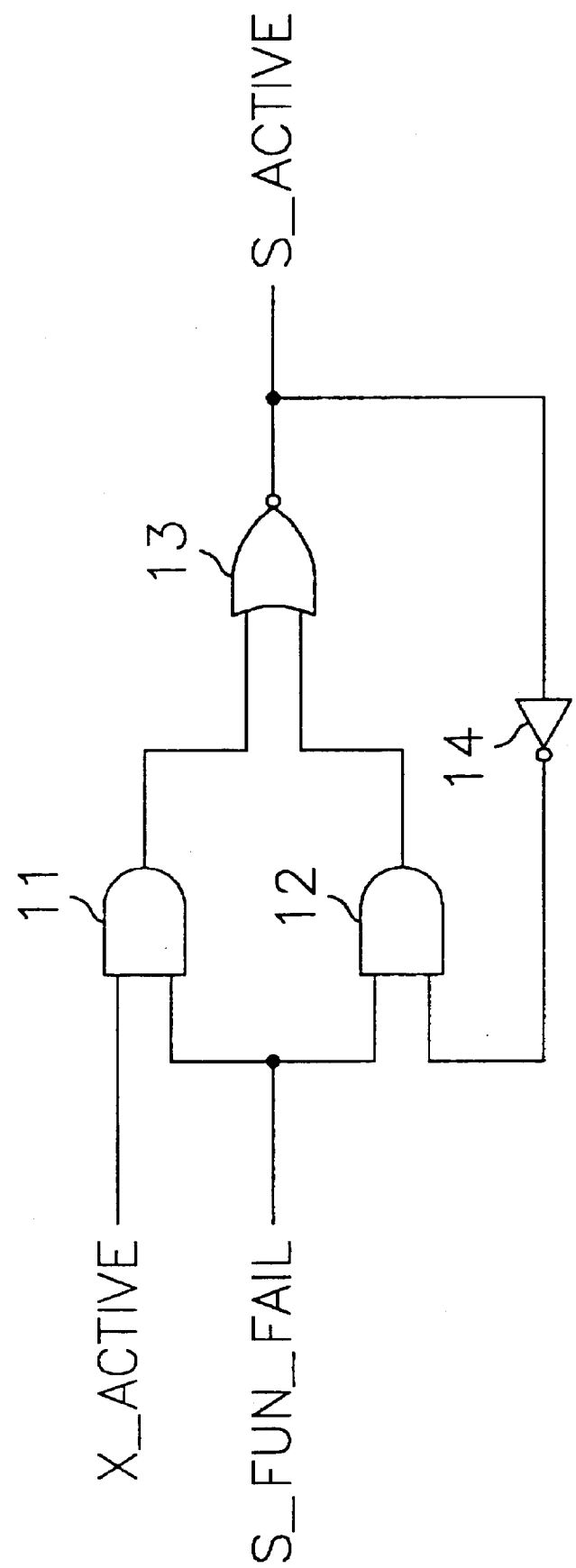
FIG. 1 describes conventional logic devices that determine an active or a stand-by mode of duplicated mates.
Figure 2:
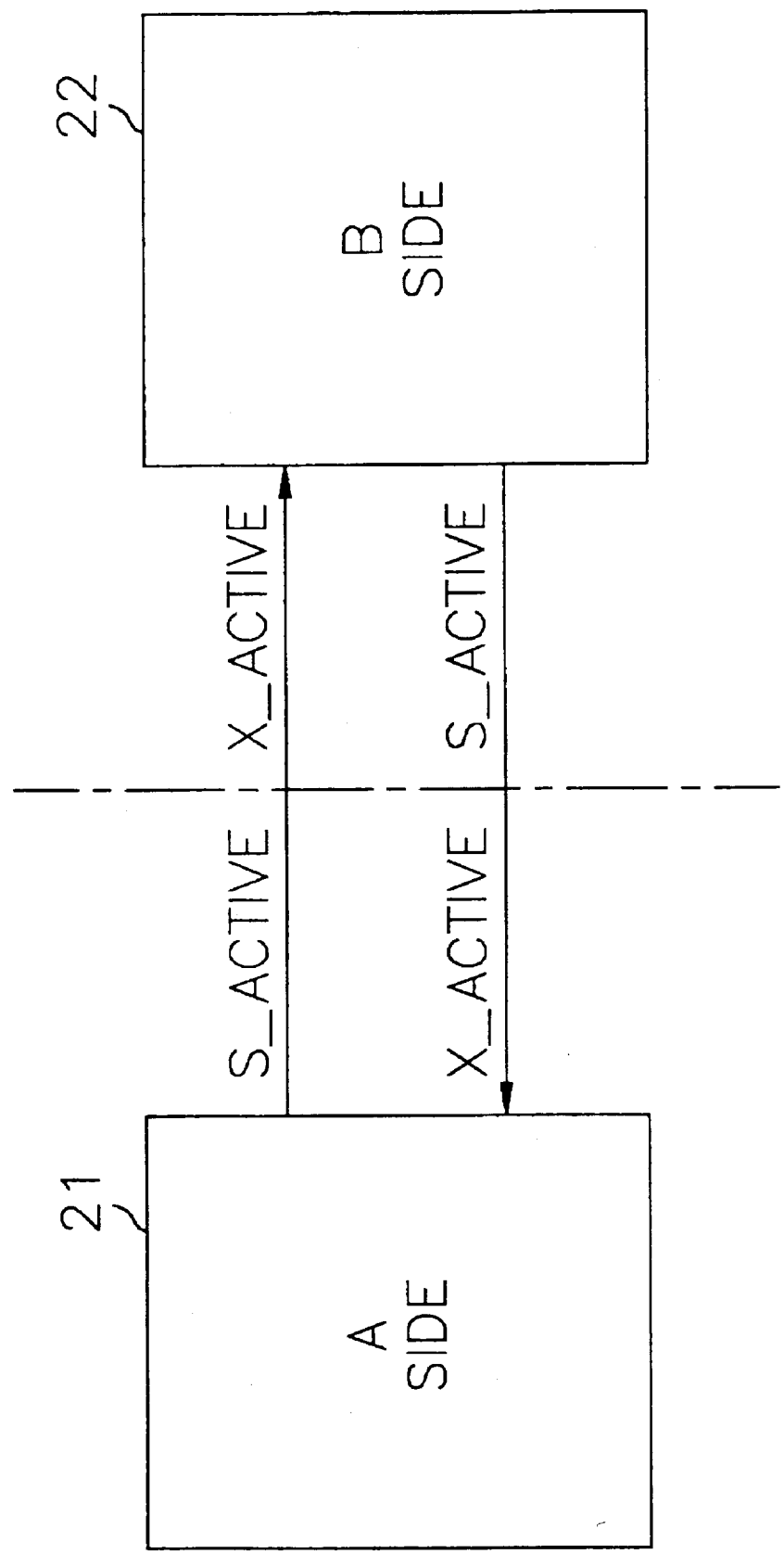
FIG. 2 illustrates a conventional duplicated system.
Figure 3:
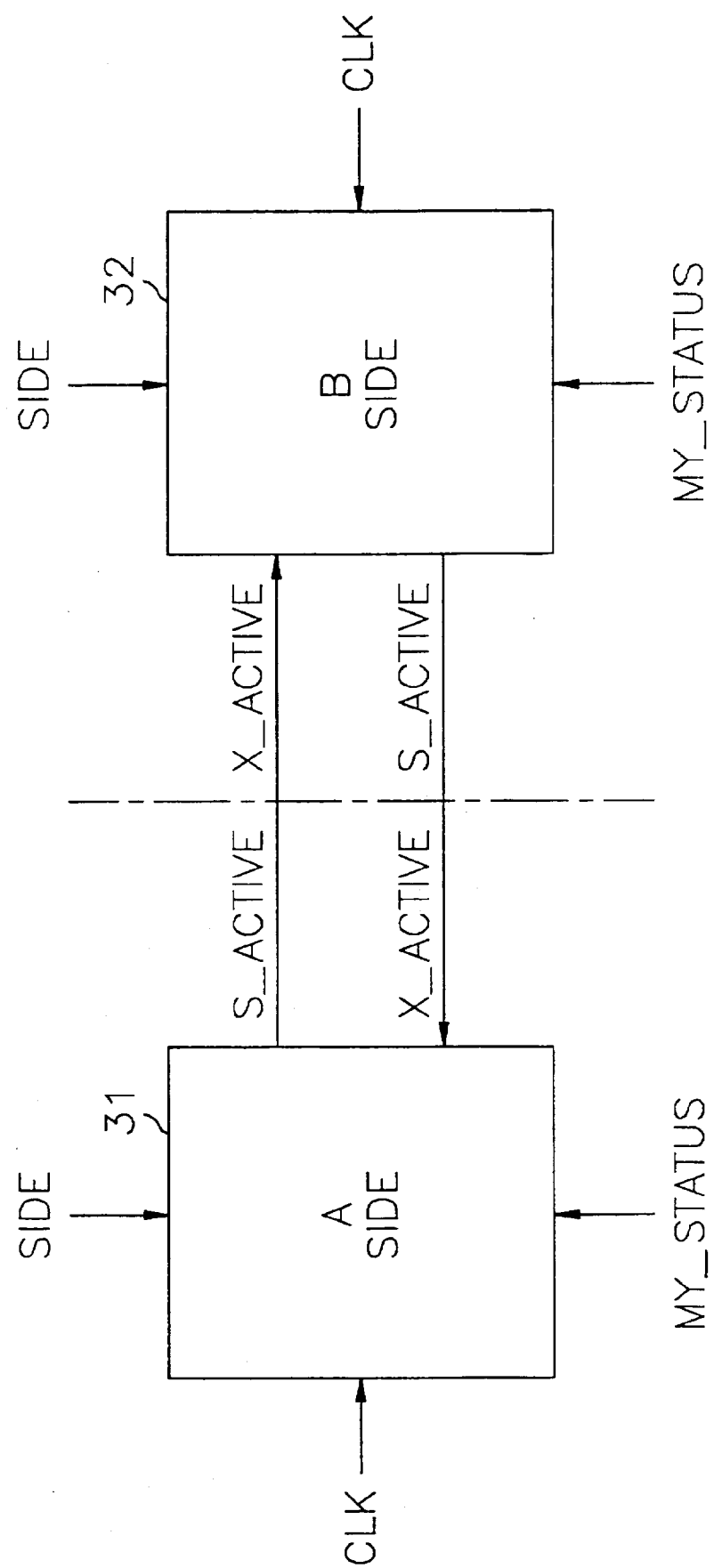
FIG. 3 shows an inventive duplicated system.

Referring to FIG. 3, there is illustrated a duplicated system in accordance with the present invention.

The inventive duplicated system is comprised of two subsystems, an A side and a B side. A structure and functions of the subsystems are identical to each other. The subsystems operate alternatively in such a way that one is in an active mode while the other is in a stand-by mode.

A S_ACTIVE(SELF ACTIVE) is a signal indicating whether a subsystem itself in the duplicated system is in the active mode or in the stand-by mode.

An X_ACTIVE(external active) is a signal signifying whether a counterpart of a subsystem in the duplicated system is in the active mode or in the stand-by mode.

A CLK is a clock signal used in such a way that the duplicated system operates in synchronism with the CLK.

A SIDE is a selection signal presenting which subsystem is in the active mode.

A MY_STATUS is a signal indicating whether a subsystem itself is functionally normal or abnormal.

The S_ACTIVE of a subsystem is regarded as the X_ACTIVE at the counterpart subsystem, and vice versa.

The SIDE and the MY-STATUS are sent to the duplicated system by a supervising unit(not shown). The CLK is fed to the duplicated system from a clock generator(not shown). Among them, the SIDE and the CLK are commonly fed to each of the duplicted system from a common source. On the other hand, the MY_STATUS at the A side may be different from that at the B side.

The SIDE is fed to each of the duplicated mates. If the SIDE is "low", the A side is designed to be in the active mode while the B side is in the stand-by mode; otherwise, i.e., if the SIDE is "high", the B side is in the active mode while the A side is in the stand-by mode.

The CLK is also fed to the inventive duplicated system to make the inventive duplicated system operate in synchronism with the CLK. The operation in synchronism with the CLK enhances a reliability of the inventive duplicated system since the operation in synchronism can avoid possible asynchronous error that may occur at the time of a switch-over from one subsystem to the other subsystem.

Figure 4:
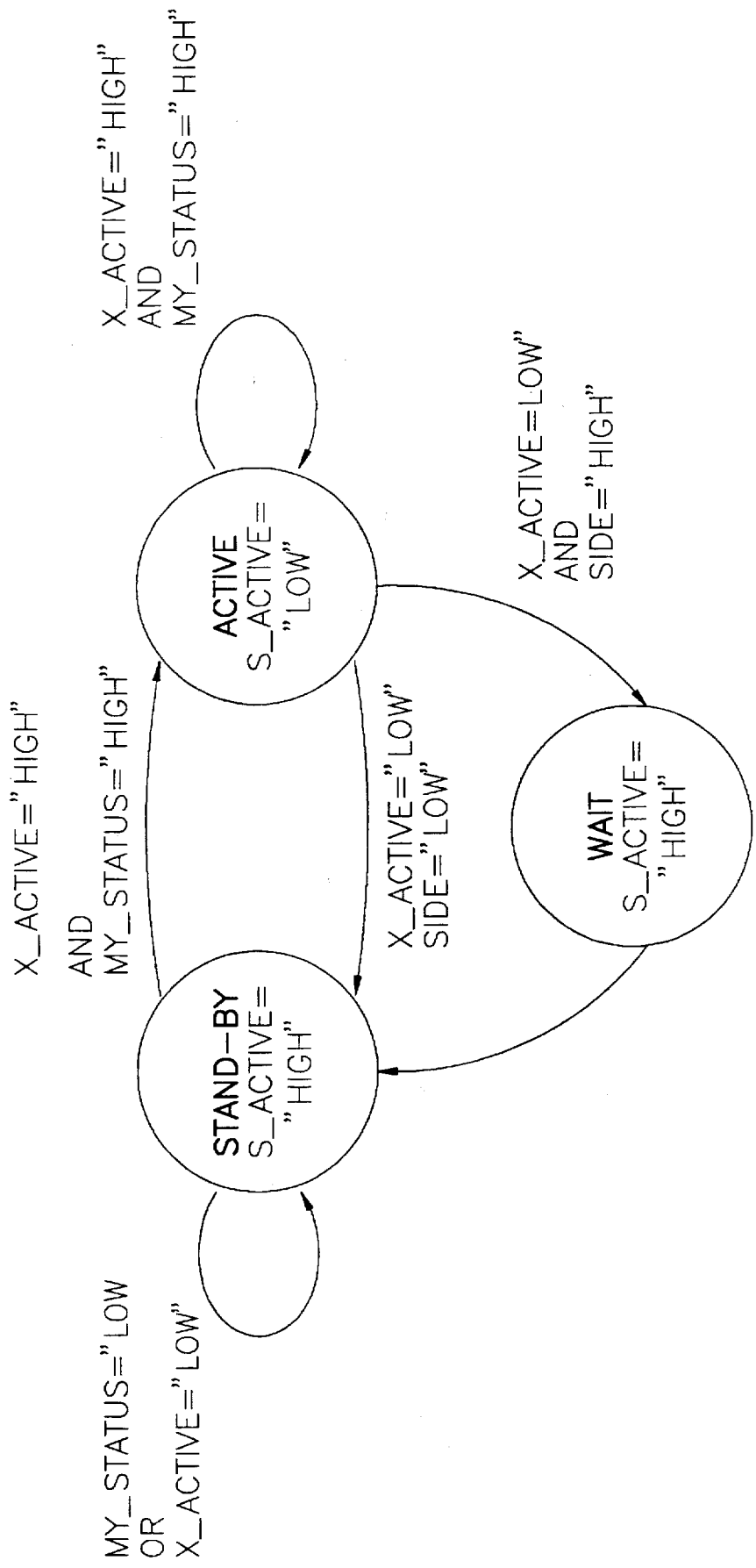
FIG. 4 describes a state diagram showing a state transition occurring in the inventive system.

The operation of the inventive duplicated system will be described by reference to a state diagram shown in FIG. 4.

Upon turning-on of the inventive duplicated system, the A side and the B side enter into the stand-by state, i.e., the S_ACTIVE of the A side and the B side become "high".

At a rising edge of the CLK, the duplicated system checks the X_ACTIVE and the MY-STATUS at the A side. For the purpose of illustration, the A side has a priority over the B side. Only if the X_ACTIVE and the MY-STATUS are "high", the mode of the A side changes to the "ACTIVE"; otherwise, the mode is unchanged.

After the A side becomes active, the duplicated system checks the X_ACTIVE to figure out whether the A side and the B side will be all in the active mode at the next rising edge of the CLK. If the X_ACTIVEs are all "low", which implies that both of the two subsystems are in the active mode, the two subsystem switches into the stand-by or a wait mode so as to place only one side on the active mode. In this event, the SIDE is checked to see which side is in the active mode. Since the SIDE is "low", i.e., the side A has the priority, the A side enters into the stand-by mode while the B side enters into the wait mode. If, on the other hand, the SIDE is "high", the B side enters into the stand-by mode while the A side enters into the wait mode. The A side is given priority since it is designed that the stand-by mode rather than the wait mode is the only mode qualified to move immediately to the active mode.

If the A side is selected, i.e., the SIDE is "low", the A side switches into the active mode at the next rising edge of the CLK; if the B side is selected, i.e., the SIDE is "high", the B side waits for one period of the CLK. At the rising edge right after the one period of the CLK, the B side enters into the stand-by state.

The B side enters into the stand-by mode after one period delay of the CLK, therefore, it will never occur that the A side and the B side enter again into the active mode at the same time. The one period of the CLK to avoid a conflict between the A side and the B side can be elongated to two or more periods, wherein the conflict refers to a condition that the A side and the B side concurrently bid for the active mode.

The A side having switched into the stand-by mode prior to the B side checks the MY-STATUS. If the MY-STATUS is "high", the A side switches into the active mode. The B side checks the X_ACTIVE. Since the X_ACTIVE is "low", the B side stays in the stand-by mode.

Considering the foregoing description, the inventive duplicated system has a lot of advantages over the conventional counterpart.

First, the operation in synchronism with the CLK enhances a reliability of the inventive duplicated system since the operation in synchronism can help to avoid errors that may occur at the time of a switch-over from one subsystem to the other subsystem in an asynchronous operation.

Second, the operation of the inventive duplicated system is stabilized since the conflict in bidding of the active mode can be duly settled.

Third, a priority can be conveniently given to a preferred subsystem at an operator's discretion by using the SIDE.

While the present invention has been described with respect to the preferred embodiments, other modifications and variations may be made without departing from the scope and spirit of the present invention as set forth in the following claims.

What is claimed is:

1. An active/stand-by mode determination method for use in a duplicated system, wherein two elements, one given a priority over the other, in the duplicated system operate in an active mode and a stand-by mode alternatively selected based on a decision made by using an X_ACTIVE signal, a S_ACTIVE signal, a STATUS signal for each element, and a SIDE signal, wherein the S_ACTIVE signal is a signal indicating whether an element in the duplicated system is in the active mode or in the stand-by mode; the X_ACTIVE is a signal indicating whether a counterpart element in the duplicated system is in the active mode or in the stand-by mode; the STATUS signal is for indicating whether an element itself is normal or not; the SIDE signal is a signal determining which element is in the active mode, the method comprising the steps of:

a) setting both the elements in the stand-by mode upon power-on;
 b) checking the X_ACTIVE signal and the STATUS signal at both the elements;
 c) switching an element into the active mode if it is determined at the step b) that both the X_ACTIVE signal and the STATUS signal at the element are "high";
 d) keeping an element in the stand-by mode if it is determined at the step b) that at least one of the X_ACTIVE signal and the STATUS signal at the element is "low";

e) checking if both the elements are in the active mode;

f) checking the SIDE signal if it is determined that both the elements are in the active mode at the step e); and g) moving the element given a priority into the stand-by mode if the SIDE signal is determined to be "low" at the step f).

2. The active/stand-by mode determination method of claim 1, wherein the duplicated systems operate in synchronism with a clock signal.

3. The active/stand-by mode determination method of claim 2, wherein the method further comprises the step of:

h) switching the other element into a wait mode if the SIDE signal is determined to be "high" at the step f); and i) switching the other element into the stand-by mode once the mode of the element given a priority becomes active and switching the other element into the active mode once the mode of the element given a priority becomes stand-by.

4. The active/stand-by mode determination method of claim 2, wherein the step i) occurs after one or more periods of the clock signal after the step h).

5. The active/stand-by mode determination method of claim 3, wherein the step i) occurs after one or more periods of the clock signal after the step h).

\* \* \* \* \*